(12) United States Patent
Trequattrini et al.

(10) Patent No.: US 6,191,584 B1
(45) Date of Patent: Feb. 20, 2001

(54) PERMANENT MAGNET FOR NMR IMAGE DETECTION

(75) Inventors: Alessandro Trequattrini; Gianluca Coscia; Carlo Sanfilippo, all of Genoa; Eugenio Biglieri, Masio, all of (IT)

(73) Assignee: Esaote, S.P.A., Casale Monferrato (IT)

( * ) Notice: Under 35 U.S.C. 154(b), the term of this patent shall be extended for 0 days.

(21) Appl. No.: 09/199,811

(22) Filed: Nov. 25, 1998

(30) Foreign Application Priority Data

Dec. 5, 1997 (IT) .......................................... SV97A000048

(51) Int. Cl.⁷ ...................................................... G01V 3/00
(52) U.S. Cl. ............................................ 324/319; 324/320
(58) Field of Search ................................... 324/319, 320, 324/318, 322; 335/296, 299

(56) References Cited

U.S. PATENT DOCUMENTS

| | | |
|---|---|---|
| 4,675,609 | 6/1987 | Danby et al. . |
| 4,777,464 | 10/1988 | Takabatashi et al. . |
| 4,818,966 | 4/1989 | Miyamoto et al. . |
| 5,438,264 | 8/1995 | Takeshima et al. . |
| 5,475,355 | 12/1995 | Abele et al. . |
| 5,495,222 | 2/1996 | Abele et al. . |
| 5,565,834 | * 10/1996 | Hanley et al. ........................ 335/296 |
| 5,621,324 | * 4/1997 | Ota et al. ............................. 324/319 |

FOREIGN PATENT DOCUMENTS

| | | |
|---|---|---|
| 0 262 880 | 4/1988 | (EP) . |
| 95/28657 | 10/1995 | (WO) . |
| 96/29614 | 9/1996 | (WO) . |

OTHER PUBLICATIONS

Development of a Permanent Magnet Assembly for MRI, T. Miyamato et al., Sep. 5, 1990, IEEE Translation Journal on Magnetics in Japan, vol. 5, No. 9, pp. 803–809.

Compensation of Field Distortion With Ferromagnetic Materials and Permanent Magnets, M. Abele, et al., May 15, 1994, Journal of Applied Physics, No. 10, pp. 6990–6992.

* cited by examiner

Primary Examiner—Louis Arana
(74) Attorney, Agent, or Firm—Burns, Doane, Swecker & Mathis, L.L.P.

(57) ABSTRACT

A permanent magnet for nuclear magnetic resonance image detection, includes a magnetic structure having a yoke and magnetic poles, so shaped as to delimit or enclose a cavity, at least a part of a volume of the cavity forms a compartment for receiving at least a part of a body under examination, and at least a part of the volume of the cavity is permeated by a static magnetic field having specific intensity and homogeneity characteristics; the magnetic structure has at least one open side, parallel to the static magnetic field; the magnetic structure has at least two opposite main poles, lying face to face, transverse to the open side, the static magnetic field being generated therebetween; in the vicinity of the open side, the magnet has a device for correcting the static magnetic field generated between the main poles, the correction device including an element for increasing the magnetic potential near the open side, and over a predetermined depth therefrom, transverse to the open side, without reducing the span of the opening.

38 Claims, 14 Drawing Sheets

PERMANENT MAGNET FOR NMR IMAGE DETECTION

BACKGROUND OF THE INVENTION

1. Field of the Invention

The invention relates to a permanent magnet for nuclear magnetic resonance image detection, either of the total-body type, for receiving a considerable part of the body, or the whole body, or of the dedicated type, i.e., for detecting nuclear magnetic resonance images only relating to certain parts of the human body.

2. Description of Related Art

In order to obtain spin-echo signals for reconstructing sufficiently faithful images of the part under examination, i.e., valid images, therefrom, the body, or the part thereof under examination must be exposed, in nuclear magnetic resonance machines, to a static magnetic field, having, in the image detection region, certain intensity and homogeneity characteristics. These characteristics are determined by predetermined tolerances.

As extensively discussed in U.S. Pat. No. 5,495,222, an ideal static magnetic field is obtained through a magnetic structure which closes the cavity or the volume for receiving the body or the part thereof on all sides.

Theoretically, the provision of magnets of this type is possible, but they must be considerably large, so as to allow the whole body, for example of a patient, to be received therein. Such a machine is definitely expensive and cumbersome, and involves safety and comfort drawbacks for the patient.

Therefore, prior art machines have cavity-delimiting magnetic structures with at least one open side, with two open sides, generally opposite to each other, or with three or more open sides, like in C-shaped magnetic structures, and in structures having only two opposite and spaced poles and being open all along the peripheral shell of the two poles, except for supporting members, like columns.

Owing to the provision of one or more open sides of the magnetic structure, in that region the magnetic field is diffused out of the structure. Here, the field lines are outwardly swelled, and the field intensity and homogeneity progressively decrease, as the field approaches the open side or sides of the structure. The magnetic field volume having sufficient intensity and homogeneity characteristics for image detection is thus reduced, with respect to the total volume of the cavity defined by the magnet, and with respect to the total volume of the structure thereof.

The immediate solution thereto would be an enlargement of the magnet structure, so as to keep the useful image detection volume as distant as possible from the open side or sides. However, also owing to the necessary relationship between the useful volume and the volume or extension of the body, or the part thereof, to be examined, this solution involves very unfavorable ratios between the total magnet size and the useful image detection volume, i.e., the volume within which the static field has sufficient characteristics for detecting valid nuclear magnetic resonance images. In practice, the magnet structure must have a huge size, and be expensive, both as regards construction and as regards purchasing costs and location of the equipment at the final user's site.

Although this drawback is less serious in the total-body machines, i.e., those having a magnet structure which receives the whole patient body or at least a considerable part thereof, the situation described above is much more burdensome in dedicated machines, i.e., small machines for detecting images of certain localized, specific body parts.

Dedicated machines use small magnetic structures, which must be relatively handy and light. The size compaction of the magnetic structures requires a high ratio between the space requirement of the structure and the useful image detection volume, and between the total cavity volume defined by the magnet and the useful image detection volume. Said useful volume should fill up a considerable part of the total cavity volume.

The problems related to dedicated machines are still more serious because, in order to provide highly flexible machines for several body parts having different anatomic and morphologic characteristics, the magnet structure must have an increasingly great number of open sides.

In certain types of permanent magnets, such as in the magnet described in U.S. Pat. No. 5,495,222, that is a C-shaped magnet with two open sides transverse to the axis of its C shape and one open side parallel thereto, in order to compensate field aberrations there are provided correction means at one open side, consisting in this case of extensions being directed to partially close the opening on the side parallel to the axis. The aberrations at the sides transverse to the axis of the C shape are not compensated, since the magnet is long enough to keep the open sides sufficiently distant from the relevant volume.

The magnet according to this document is of the total-body type, and the patient body is introduced therein in the direction of the axis of the C shape, whereas the partially open side, parallel to the axis, has the function to allow physicians or paramedics to perform operations on the patient.

OBJECTS AND SUMMARY

Therefore, the present invention aims at providing a magnet of the type described hereinbefore, which allows for a size reduction of the magnetic structure, while providing at least the same useful image detection volume, or even increasing the ratio between the useful image detection volume and the total space requirement of the magnet, allowing it to be made of such a shape that all its open sides may be indiscriminately used for introducing the patient therein, and having a small number of parts, with a simple geometry, and a relatively easy fabrication with sufficient tolerances.

The invention achieves the above purposes, with a magnet of the type described hereinbefore, in which in the vicinity of the open side or sides, the magnet has means for correcting the static magnetic field generated between the main poles, which correction means are intended to increase the magnetic potential near the opening, and over a predetermined depth therefrom, transverse to the open side, without reducing the span of said opening.

Hence, at the open side or sides, there is provided a pair of opposite auxiliary poles, inwardly penetrating over a predetermined distance toward their respective main poles, which auxiliary poles are provided with magnetized material, according to two alternative or combined methods. The magnetized material associated with the auxiliary poles is in larger quantity and of different quality with respect to the magnetized material associated with the main poles, in such a way as to obtain an increase of the magnetic potential in the area between said auxiliary poles with respect to that between the main poles. Alternatively, the magnetized material associated with the auxiliary poles is equal as regards quantity and type to the magnetized material associated with the main poles, whereas, between the main pole and the adjacent auxiliary pole, a magnetized insert is interposed, so as to generate a magnetic potential difference between the main poles and the adjacent auxiliary poles, whereby the magnetic potential of the auxiliary poles is increased with respect to the potential of the main pole and to the detriment thereof, the whole while keeping the distance between the pairs of opposite auxiliary poles at least equal to, or greater than the distance between the main poles.

The two solutions, which may be provided either singularly or in combination, allow for the generation of a peripheral magnetic field near the opening, creating such conditions as to bring the static magnetic field between the main poles back to a condition of sufficient intensity and homogeneity, within predetermined tolerances, substantially for the whole volume interposed between the main poles and defined thereby.

The two arrangements may be provided, either independently or in combination, for any type of magnet configuration, be it with one, two, three, four or more open sides, or with a peripheral completely open covering.

The first option consists in increasing the potential of the magnetic field between the auxiliary poles with respect to the main poles, without decreasing the field between the main poles. This is obtained by providing a greater quantity of magnetized material at the auxiliary poles, or by using a magnetized material of a different type, being fit for generating magnetic fields having a higher intensity than other magnetized materials, when equal volumes thereof are compared. In this case, the auxiliary pole, comprising a plate of a high-permeability material, is thinner than the main pole, so as to terminate with its inner face at least coplanar to the face of the main pole, or receding with respect to it, with reference to the direction perpendicular to said faces of the main and auxiliary poles.

Therefore, as a result of the invention, the effect of the open sides of the magnet on the static field in the useful image detection volume may be reduced. This is achieved in a very simple and safe way.

The present invention involves considerable advantages when applied to machines of the dedicated type, according to the above definition. The correction barriers according to the invention limit the penetration of aberrations in the region of the main poles, thereby extending the volume within which the static field has sufficient characteristics for image detection to the whole volume defined by the main poles. This may be achieved without extending the length of the magnet, so as to keep the openings distant from the main poles, and thus contributing to keep the magnet size compact. Moreover, by keeping the inner surfaces of the opposite auxiliary poles at a distance at least equal to, or greater than that between the opposite inner surfaces of the main poles, the distance between the two main poles is kept at the bare minimum. When the auxiliary poles are even at a greater distance than the main poles, an opening may be generated for receiving body parts, next to the ones under examination, which are even larger than the latter. This may be the case of the shoulder, which is thinner than the thorax.

Several magnetization vectors may be provided for the magnetized materials of the main poles and of the auxiliary poles, and generally, the layers of magnetized material associated with the main poles and to the auxiliary poles have parallel magnetization vectors, oriented in the same direction, substantially perpendicular to the inner faces of the poles.

Conversely, when a magnetized insert is provided between the main pole and the auxiliary pole associated therewith, the magnetization vector associated with the insert is oriented with at least one component perpendicular to the magnetization vector of the magnetized material associated with the main poles and to the auxiliary poles.

The other magnetic field components, introduced by the magnetized element between the main poles and their respective auxiliary poles help to obtain a higher reducing and limiting effect on the swelling tendency of the magnetic field lines, at the corresponding opening.

Hence, the magnet according to the present invention has a lighter and less cumbersome and heavy construction, when at least equal useful NMR image detection volumes are compared.

According to the geometrical characteristics of the magnet, other arrangements may be associated with the characteristics described hereinbefore, as will be detailed hereafter. These characteristics and arrangements may be used both separately and in any combination thereof.

BRIEF DESCRIPTION OF THE DRAWINGS

The characteristics of the invention and the advantages derived therefrom will appear more clearly from the following description of an embodiment, illustrated, not by way of restriction, in the accompanying drawings, in which.

DETAILED DESCRIPTION OF PREFERRED EMBODIMENTS

Figure 1:
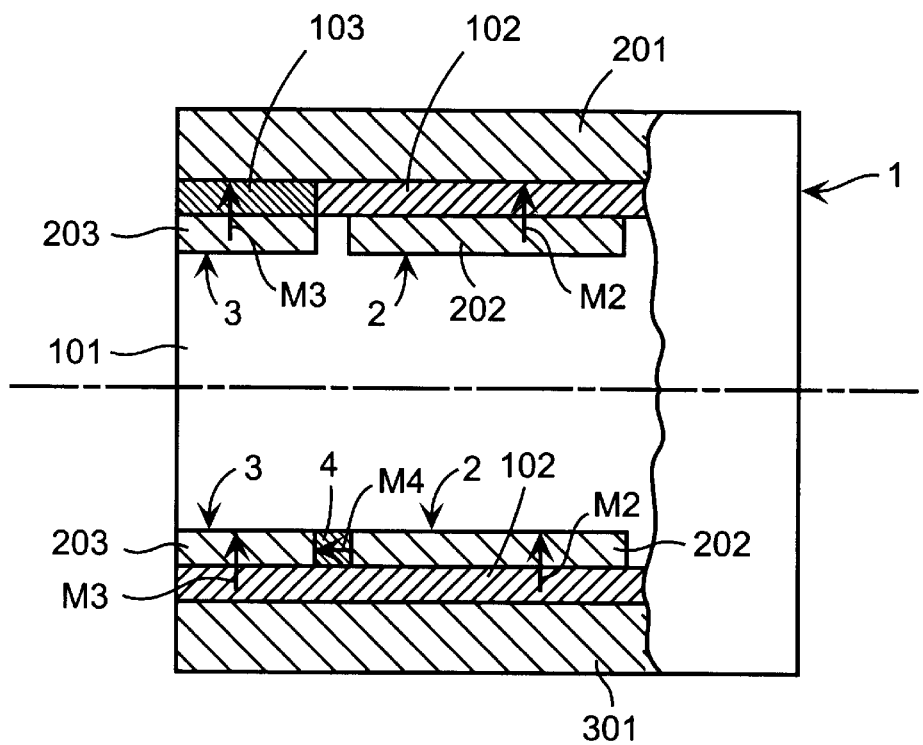
FIG. 1 is a partial sectional view, with respect to an axial plane, of a 3D magnet, having the shape of a rectangular parallelepiped, with one open side.

The permanent magnet shown in FIG. 1 is a 3D magnet and has a structure, i.e., a yoke 1, with five closed sides. The side 101 is open to allow the body under examination, or a part thereof to be introduced therein. Two parallel and opposite sides 201, 301 of the yoke inwardly bear one respective main pole 2. The two main poles 2 are parallel and opposite to each other. Along the edges of the open side 101, the two parallel sides which bear the main poles 2 have two parallel and opposite auxiliary poles 3, extending over at least a part of the sides, and at least over the same extension of the main poles 2 associated therewith. FIG. 1 shows two variant embodiments, one above and the other below the median plane parallel to the poles 2, 3.

The two variants may be provided in combination near the opening, but the magnet structure is generally symmetrical with respect to the median plane parallel to the poles 2, 3.

In the first variant embodiment, the main poles 2 have a layer of magnetized material 102, inwardly superposing the corresponding side 201 of the yoke 1, on whose free inner face a plate 202 made of a high-permeability material, i.e., of ferromagnetic material is superposed. The plate 202 functions to create a uniform and constant magnetic potential at main pole 2.

The auxiliary pole 3 is also comprised of a layer of magnetized material 103, on which a plate made of a high-permeability, particularly ferromagnetic material 203 is superposed. The plate 203 functions to create a uniform and constant magnetic potential at auxiliary pole 3. The magnetization vectors of the two layers 102 and 103 of magnetized material are parallel and oriented in the same direction, as indicated by arrows M2 and M3. The magnetized material forming the layer 103, associated with the auxiliary pole 3 is of a different type, with respect to the magnetized material forming the layer 102, associated with the main pole 2. One may be, for example, ferrite, and the other, for example, neodymium, or some other material that is different. The materials are chosen in such a way that the potential difference between the auxiliary poles 3 is higher than that between the main poles 2. For example, the magnetized material forming the layer 102 may be low energy magnetic material such as ferrite, while the magnetized material forming the layer 103 may be a higher energy magnetic material such as neodymium.

The layers 102, 103 of magnetized material have the same thickness, as well as the plates 202, 203 made of high-permeability material, whereby the auxiliary pole 3 and the main pole 2 terminate with coplanar inner faces.

Obviously, by applying the same criteria for increasing the potential between the auxiliary poles 3 with respect to the magnetic potential between the main poles 2, both the layers 103 of magnetized material and the plates 203, made of ferromagnetic, or high-permeability material, may not be as thick as the equivalent layers of the main poles 2. Thereby, the two inner faces of the main poles 2 and of the auxiliary poles 3 may still extend coplanar to and flush with each other. Or, the auxiliary poles 3 may be receded to a certain extent with respect to the main poles 2, the span of the opening at the auxiliary poles 3 being greater than the distance between the main poles 2.

As is apparent in the upper half of FIG. 1, the plate 203 of the auxiliary pole 3 is at a distance from the plate 202 of the main pole 2.

The lower half of the magnet according to FIG. 1 shows a variant embodiment, in which the layer of magnetized material 103, associated with the auxiliary pole 3 is provided in the same quantity, i.e., of the same thickness as the layer 102, associated with the main pole 2. The layer of magnetized material 102 may be any type of magnetized material, so long as the magnetic field generated is sufficiently strong for imaging. Preferably, the layer of magnetized material 102 is a high energy magnetic material, such as neodymium. However, it should be understood that magnetized material 102 may be a lower energy magnetic material, so long as a sufficiently strong magnetic field is generated.

The plates 202, 203, made of the high-permeability material, also have the same thickness. In this case, a magnetized insert 4, wholly made of magnetized material, or of a part of magnetized material and a part of nonmagnetized material, either of the high-permeability or of the low-permeability type, is interposed between the auxiliary pole 3 and the main pole 2. The magnetized insert 4 has a magnetization vector M4 with at least one component perpendicular to the magnetization vectors M2 and M3 of the main and auxiliary poles 2 and 3, or parallel to the faces thereof. Preferably, in the configuration as shown in FIG. 1, the magnetization vector M4 of the intermediate pole has a single component perpendicular to the magnetization vectors M2 and M3 of the layers 102, 103 of the main and auxiliary poles 2, 3.

While in the first variant embodiment, the higher magnetic potential of the auxiliary poles 3 limits the swelling effect and thus the intensity reduction in the main pole region, facing the open side 101, in the second variant, because of the magnetized insert 4, the potential of the magnetic field of the auxiliary pole 3 is increased to the detriment of the main pole 2, thereby obtaining the same effect as in the variant shown in the upper half of FIG. 1, though with a lower reduction of the field mean value.

Figure 2:
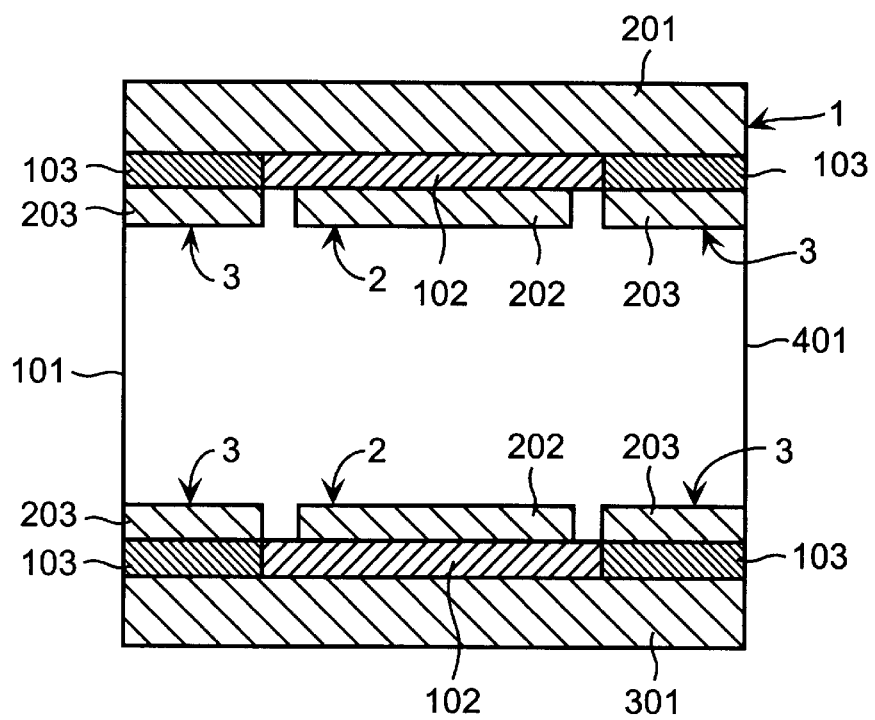
FIG. 2 is a sectional view, with respect to an axial plane, of a magnet whose shape substantially corresponds to that of FIG. 1, having two opposite open sides.
Figure 3:
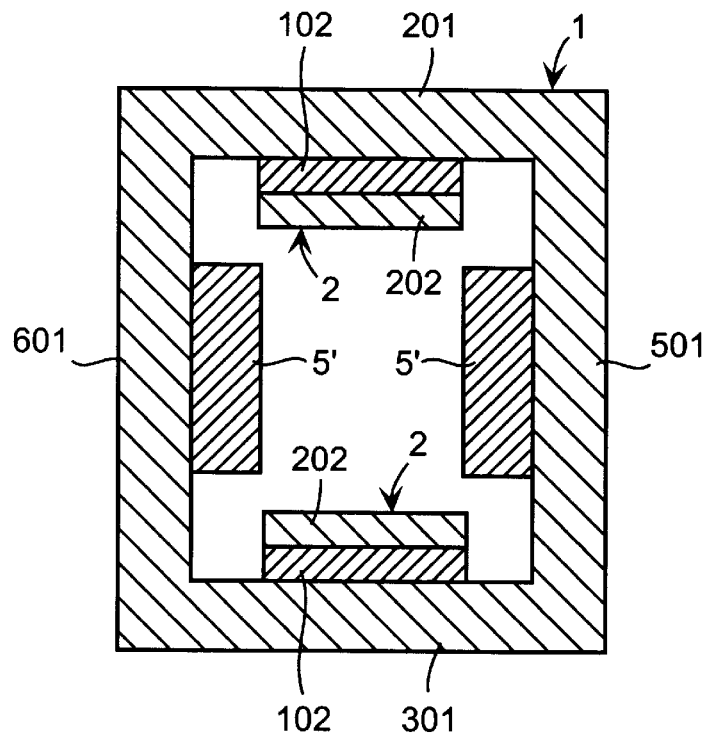
FIG. 3 is a sectional view of the magnet according to FIG. 2, with respect to a radial plane.

FIGS. 2 and 3 show another magnet, having an annular shape, i.e., with two opposite open sides 101, 401. In this case, the second open side 401 also has a pair of auxiliary poles 3. In the figures, the auxiliary poles 3 are like those of the first variant embodiment described with reference to the upper half of FIG. 1. Nevertheless, a configuration corresponding to the second variant, shown in the lower half of FIG. 1, may be also provided, at both open sides 101, 401, and there may be possibly provided a variant on one open side and the other on the opposite open side, for example when the useful image detection volume, delimited by the main poles 2, is required to be asymmetric.

In FIG. 3, additional magnetized blocks 5' are attached to side walls 501, 601. Magnetized blocks 5' may be either high or low energy magnetic material, such as neodymium or ferrite. Magnetized blocks 5' function to enclose the magnetic field of the structure to obtain better homogeneity of the magnetic field.

FIGS. 4 to 6 and 7 to 12 show different variant embodiments of the invention, referring to a magnet which has an additional open side parallel to the axis of the magnet according to FIGS. 2 and 3, and perpendicular to the poles 2, 3.

This side, indicated as 501, will be named the transverse side, and the closed side opposite thereto will be named the transverse connecting side 601 between the two opposite parallel sides 201, 401.

The U-shaped magnet as shown in FIGS. 4 to 12 has a yoke 1, made of a high-permeability material, composed of three plates 201, 301, 601, forming the U-shape. The plates have planar inner faces, which define a compartment substantially shaped as a rectangular parallelepiped. The plates 201, 301 are the parallel sides of the yoke 1, whereas the plate 601 is the transverse connecting side. The other three sides 101, 401, 501 are completely open.

Likewise to the above embodiments, each side 201, 301 of the yoke 1 has, on its inner face, a layer of magnetized material 102, superposed by a plate 202, made of a high-permeability material, thus forming the main pole 2.

This additional embodiment of the invention providing a U-shaped magnet with three open sides, may be obviously provided in combination with auxiliary poles 3 whose construction is identical to that described with reference to the previous embodiments according to FIGS. 1 to 3. In the example shown herein, the magnet with three open sides has auxiliary poles whose construction complies with a further variant embodiment, itself also applicable to the examples as shown in FIGS. 1 to 3.

Figure 4:
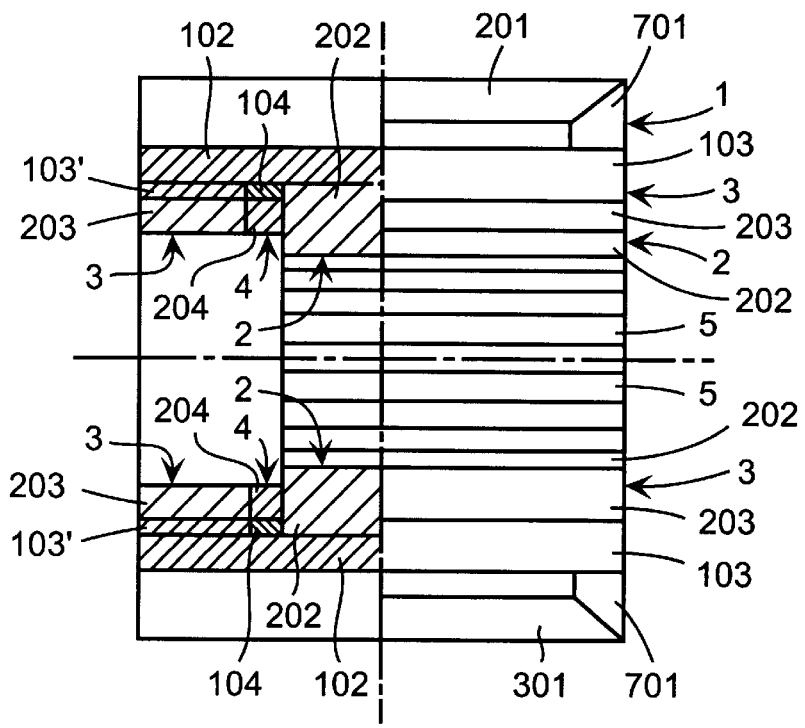
FIG. 4 shows a magnet shaped according to the previous figures, which has three open sides, in a U-shaped configuration, and more precisely the view being divided into two halves, each showing a different variant of the U-shaped magnet.
Figure 5:
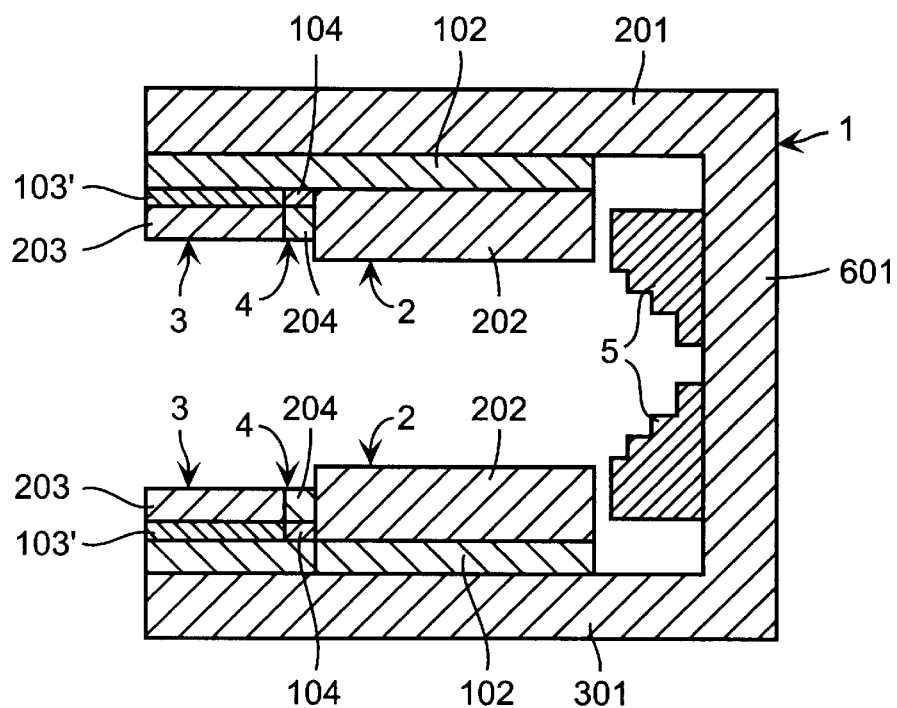
FIG. 5 is a sectional view of the U-shaped magnet according to one of the variants of FIG. 4, with respect to a plane radial to its axis.

In a first variant as shown in FIG. 4, in the right half thereof, the auxiliary poles 3 only extend along the open transverse side 501 and over the whole width thereof. The layer of magnetized material 103 associated with the auxiliary poles 3 is thicker than the layer 102 associated with the main pole 2. Particularly, the layer 102 of magnetized material, associated with the main pole 2, is made to extend under its respective auxiliary pole 3, whereas the auxiliary pole 3 further includes an additional layer 103'. Accordingly, the thickness of the layer of magnetized material 103 associated with auxiliary pole 3 is the thickness of the layer 102 plus the thickness of the additional layer 103'. The layers of magnetized material 102 and 103' may be the same type or of a different type of magnetized material, so long as the potential difference between the auxiliary poles 3 is higher than that between the main poles 2. For instance, layers 102 and 103' may both be high energy material, or may both be low energy material, or of a different type of material. In addition, the two plates 203 and 202 have different thicknesses, such that the total thickness of the layers of magnetized material 102, 103' and of the plates 202, 203 is greater in the area of the main poles 2, than in the area of the auxiliary poles 3. See FIGS. 4 and 12.

Thus, the main poles 2 are closer to each other than the auxiliary poles 3. This helps to obtain a static field having appropriate characteristics, between the main poles 2. The auxiliary poles 3, at a greater distance from each other, make the opening wider and fit for receiving larger body parts, being connected to the body parts to be examined, with no change being provided in the total size of the magnet, nor in the correcting effect of the auxiliary poles.

Between each auxiliary pole 3 and the main pole 2 associated therewith, there is provided a magnetized insert 4, consisting of a layer of magnetized material 104, and of one or more layers of low-permeability material, particularly aluminum, 204. As is apparent, the layer of magnetized material 104 is as thick as the layer 103' of magnetized material associated with the auxiliary pole 3, whereas the layer 204 of low-permeability material of the insert 4 may be, as shown, as thick as the plate 203 of the auxiliary pole 3, terminating flush with the inner face thereof.

The magnetization vectors M2, M3, M4 have the same orientation as described with reference to the previous examples.

Figure 12:
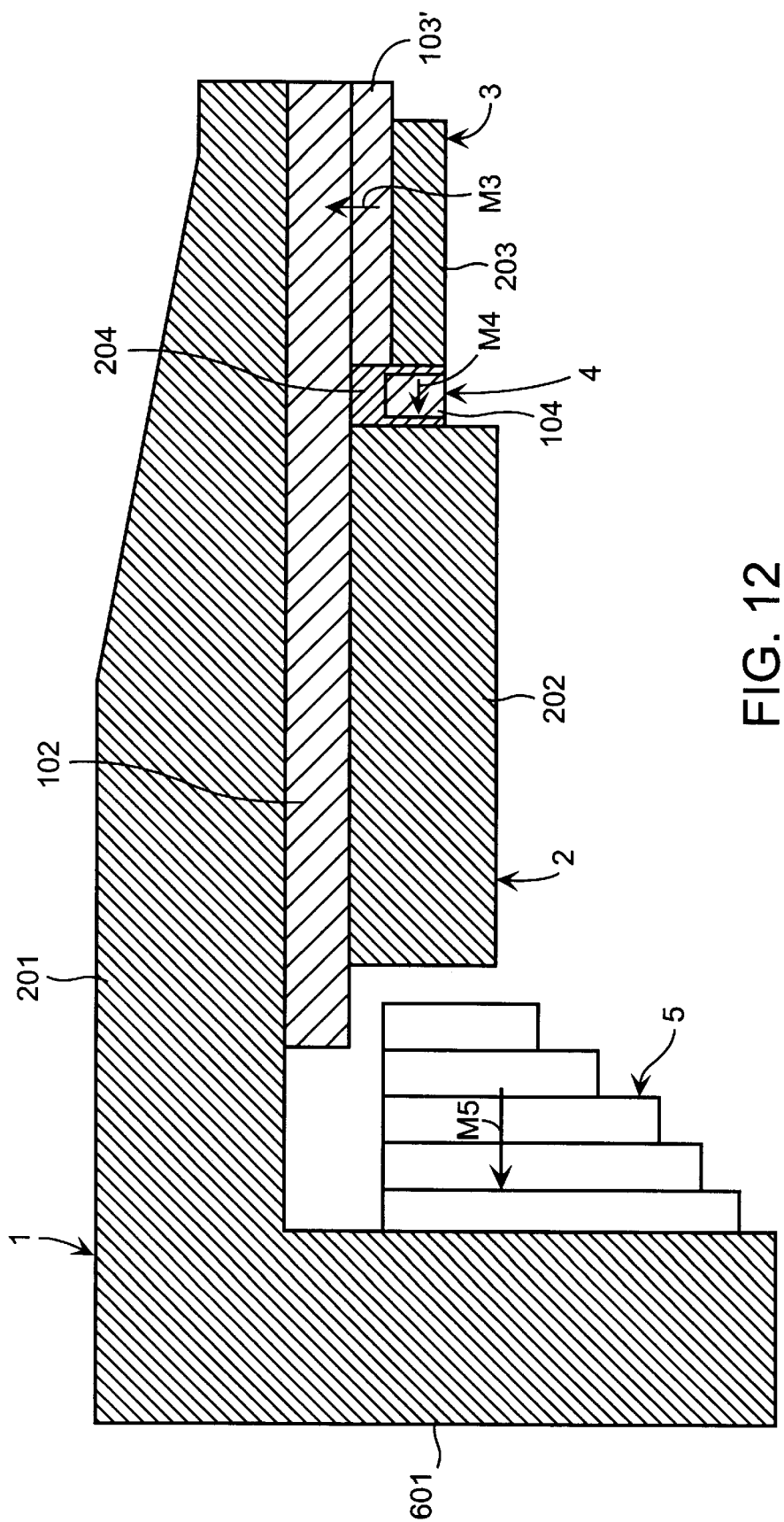
FIG. 12 shows a further embodiment of the U-shaped magnet, in which the greater thickness of the magnetized layer, associated to the auxiliary pole, has been combined to the provision of the magnetized insert.

According to an improvement, shown in FIG. 12, the layer 104 of magnetized material is completely held in a box-like compartment which is formed by the layer of low-permeability material 204, and extends also along the sidewalls of the layer 104 and may also possibly be closed at the inner face of the layer 104 of magnetized material. The purpose of the compartment 204 is to provide a better mechanical connection to the device.

Figure 11:
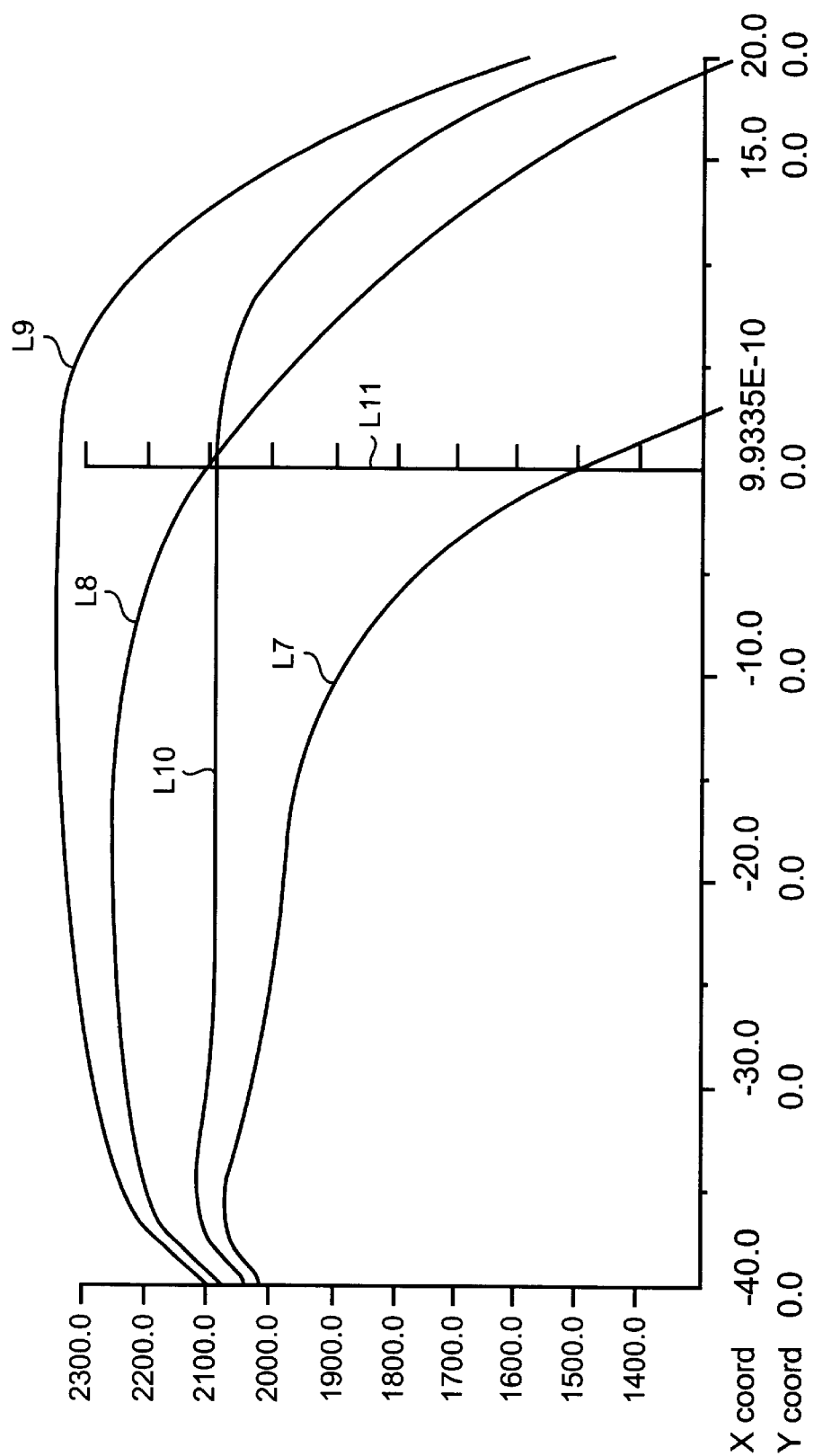
FIG. 11 is a diagram showing the curves of the magnetic field intensity, in the direction perpendicular to the poles and depending on the axis perpendicular to the closed transverse side of the yoke, related to the cases of FIGS. 7 to 10.

The effect of the magnetized insert 4 is apparent from FIG. 11.

With reference to FIGS. 7 to 10, an illustration is provided of the flux lines of the magnetic fields generated between the main poles 2 and the auxiliary poles 3, according to different configurations of the U-shaped magnet. FIG. 11 shows the curves corresponding to the magnetic field values in the direction perpendicular to the poles, whereas the X-axis measures the distance from the pole edge turned towards the open side.

Figure 7:
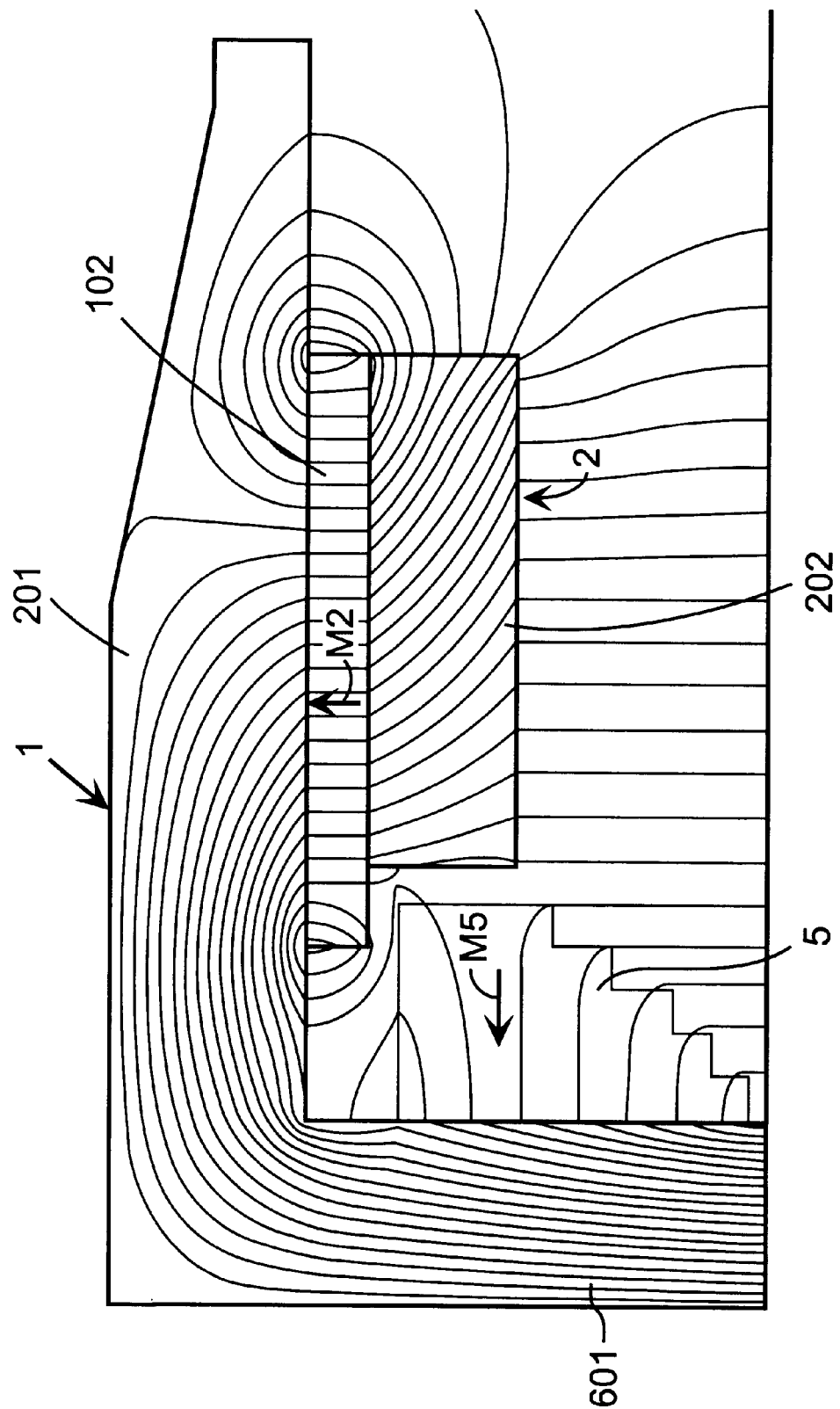
FIG. 7 schematically shows a U-shaped magnet without auxiliary poles, and the pattern of the field lines.

The magnet according to FIG. 7 has no auxiliary pole. The curve related to the field is indicated in FIG. 11 by the line L7. The magnet according to FIG. 8 has auxiliary poles and the magnetized material associated with the auxiliary pole is thicker than that corresponding to the main pole. The field curve corresponding to this magnet is indicated, in FIG. 11, by the line L8. The increased thickness corresponds, in this case, to the theoretical value which is expressly calculated to compensate for the wider portion of the cavity between the auxiliary poles, with respect to that between the main poles.

Figure 9:
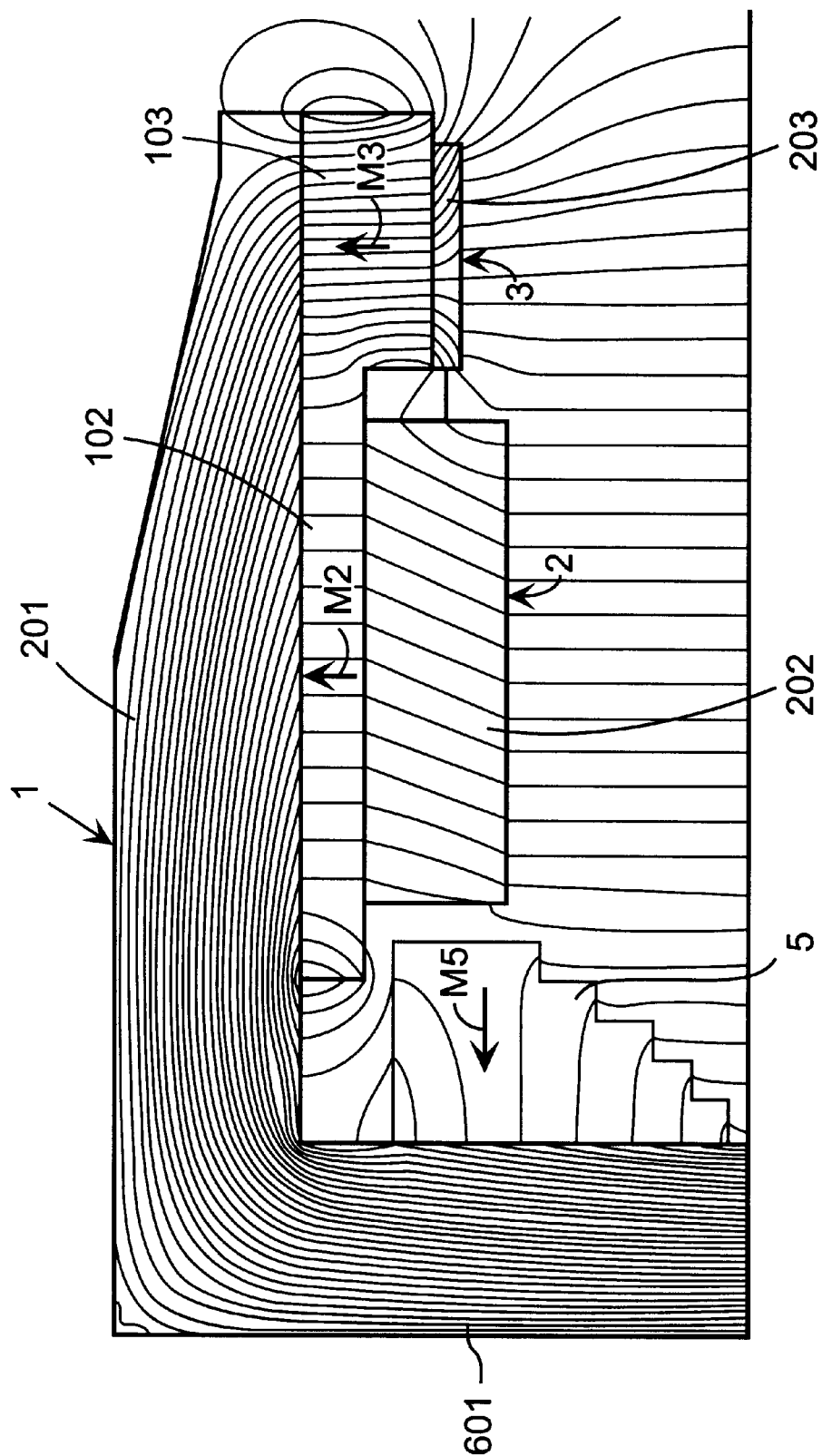
FIG. 9 shows, like FIGS. 7 and 8, the magnetic field pattern in the variant of the U-shaped magnet, wherein the opening of the magnet, in the auxiliary pole region, is only compensated by a greater thickness of the magnetic material.

The magnet according to FIG. 9 has a further increase of the magnetized material 103 associated with the auxiliary pole 3. That is, the thickness of magnetized material 103 associated with the auxiliary pole 3 is greater than the thickness of magnetized material 102 associated with the main pole 2, so that the potential difference between the auxiliary poles 3 is greater than between the main poles 2. In this embodiment, the layers of magnetized material 102 and 103 may be of the same type or differing type of material. That is, both layers 102 and 103 may be high or low energy magnetic material, or one may be of a different type than the other. The field resulting from this configuration is indicated in FIG. 11 by the line L9.

Figure 8:
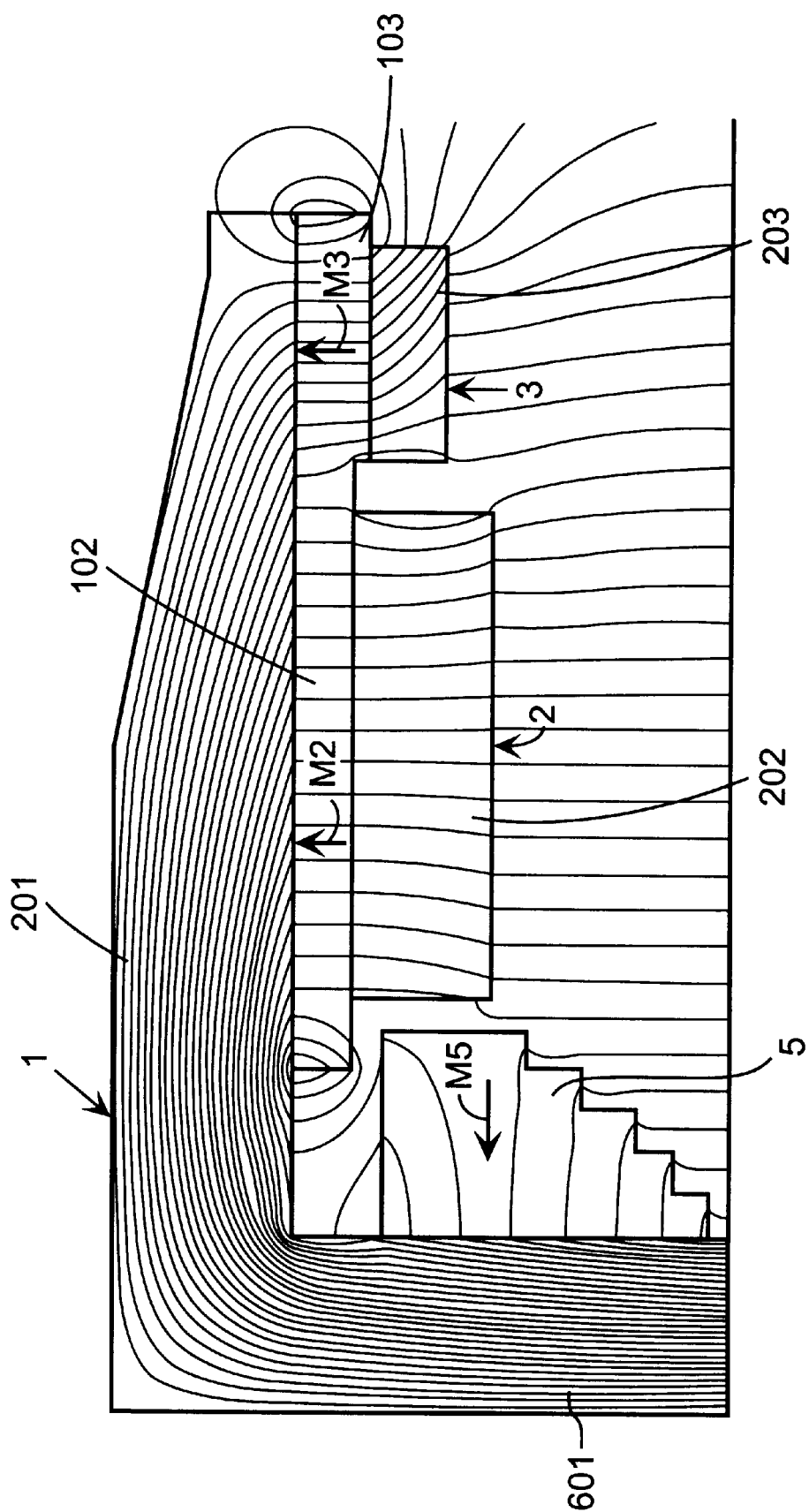
FIG. 8 shows, like FIG. 7, a first variant of the U-shaped magnet, having an auxiliary pole and an increased quantity of magnetized material associated with the auxiliary pole, with a theoretical thickness, to compensate for the cavity widening with respect to the portion associated to the main pole.
Figure 10:
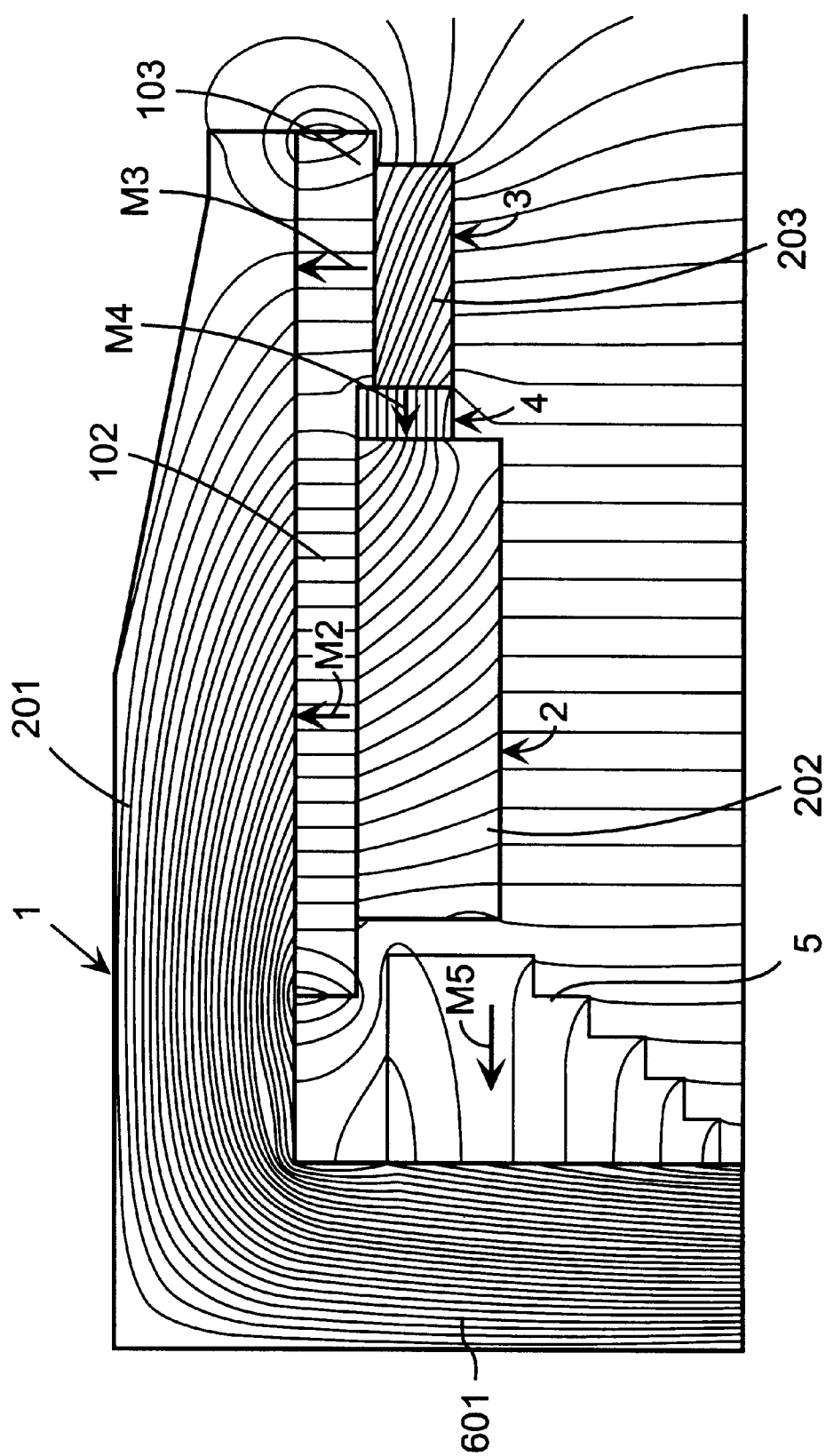
FIG. 10 shows, like FIGS. 7 to 9, the field pattern in a further alternative embodiment of the U-shaped magnet, in which a magnetized insert is provided between the main pole and the auxiliary pole.

FIG. 10 shows a U-shaped magnet as shown in FIG. 8, in which there is additionally provided a magnetized insert between the main pole and the auxiliary pole. The curve of the magnetic field for this variant is indicated in FIG. 11 by the line L10.

As is apparent from FIG. 11, in which the line L11 indicates the limit of the main pole 2 on the open side, parallel to the transverse side of the yoke, the intensity of the magnetic field in the area between the two main poles 2 dramatically and continuously falls in the direction of the open side, and before reaching the edge of the main poles 2 turned towards the open transverse side and indicated by the vertical line L11. The configuration according to FIG. 8 slightly improves this situation. The field intensity is higher, but always falls before reaching the edge of the main poles 2 turned towards the open side.

Conversely, the lines L9 and L10 indicate that in both cases the field is substantially constant for the whole extension of the main poles 2 and only falls beyond the peripheral edge of the main pole 2 turned towards the transverse open side of the magnet.

The difference between the absolute values of the two lines L9 and L10 owes to the fact that, while in the former case (L9), the application of magnetized material to the auxiliary pole generally increases the field intensity, in the latter case (L10), since the increase of the auxiliary pole 3 potential with respect to the main pole potential is obtained to the detriment of the main pole 2, the general intensity level of the magnetic field is reduced.

Better results may be obviously obtained by combining the magnet configurations according to FIGS. 9 and 10, as shown with reference to FIG. 12.

Figure 13:
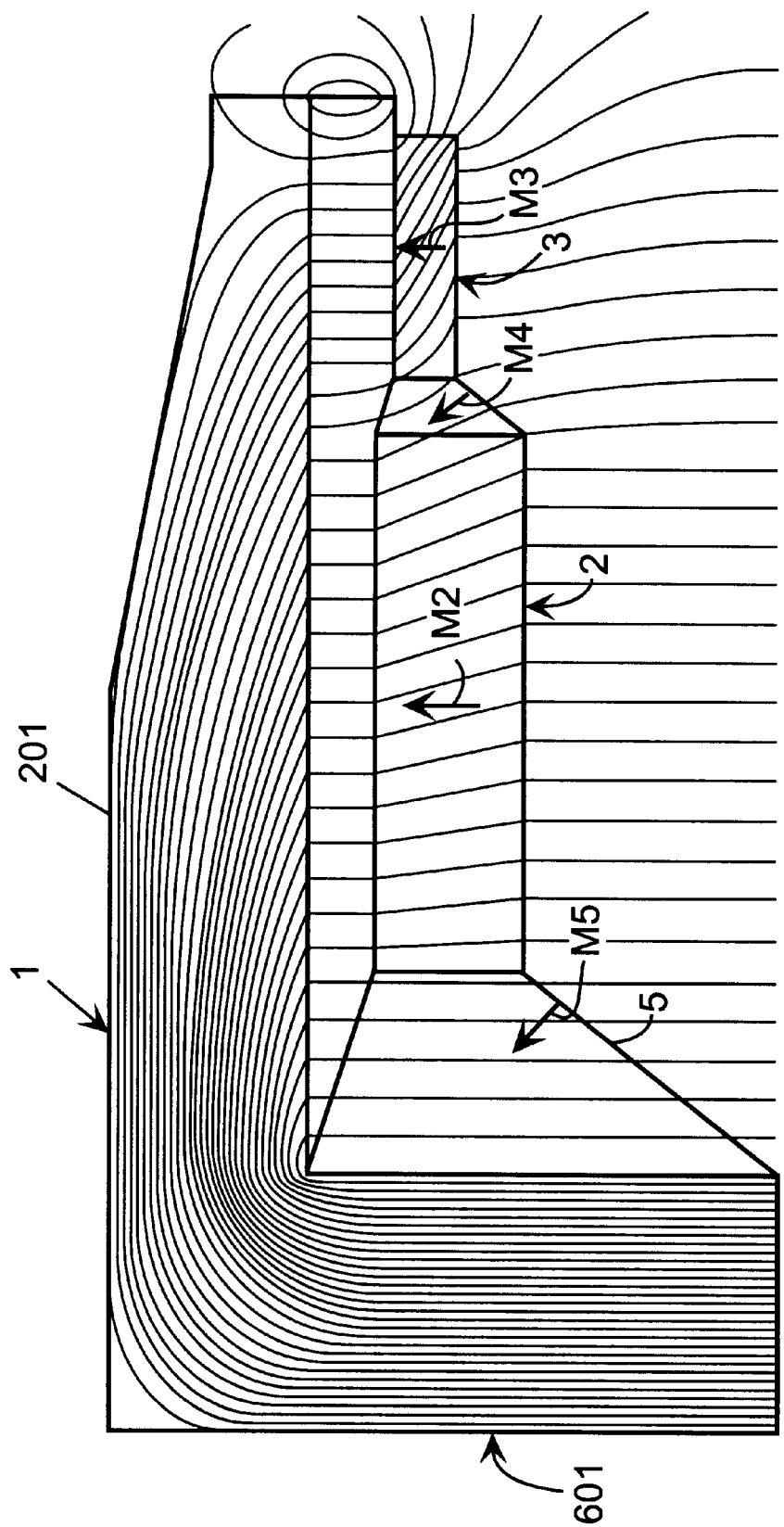
FIGS. 13 and 14 show further embodiments of the U-shaped magnet.

The magnet according to FIGS. 4 to 13 further has, at the closed side parallel to the open transverse side 501, an additional magnetized member 5, whose magnetization vector M5 has at least one component perpendicular to the magnetization vectors M1 and M2 associated with the main and auxiliary poles, 2,3, i.e., parallel to the inner faces of the poles 2,3 and a sense of the component being identical to that of the same component of the magnetization vector M4 of the magnetized inserts 4. This member 5 has the function to maintain the correct magnetic field pattern near the closed transverse side 601. The magnetized member 5 may have an inner face parallel to the field and therefore planar, otherwise concave or convex. The member 5 may be divided into two blocks, slightly spaced symmetrically with respect to the median plane parallel to the main poles 2, and may be at a distance, as shown in FIGS. 4 to 12, or in contact with the main pole, as shown in FIG. 13. The magnetized member 5 may be made of ferrite, or some other low energy material, or may be made from a high energy material, such as neodymium.

Figure 14:
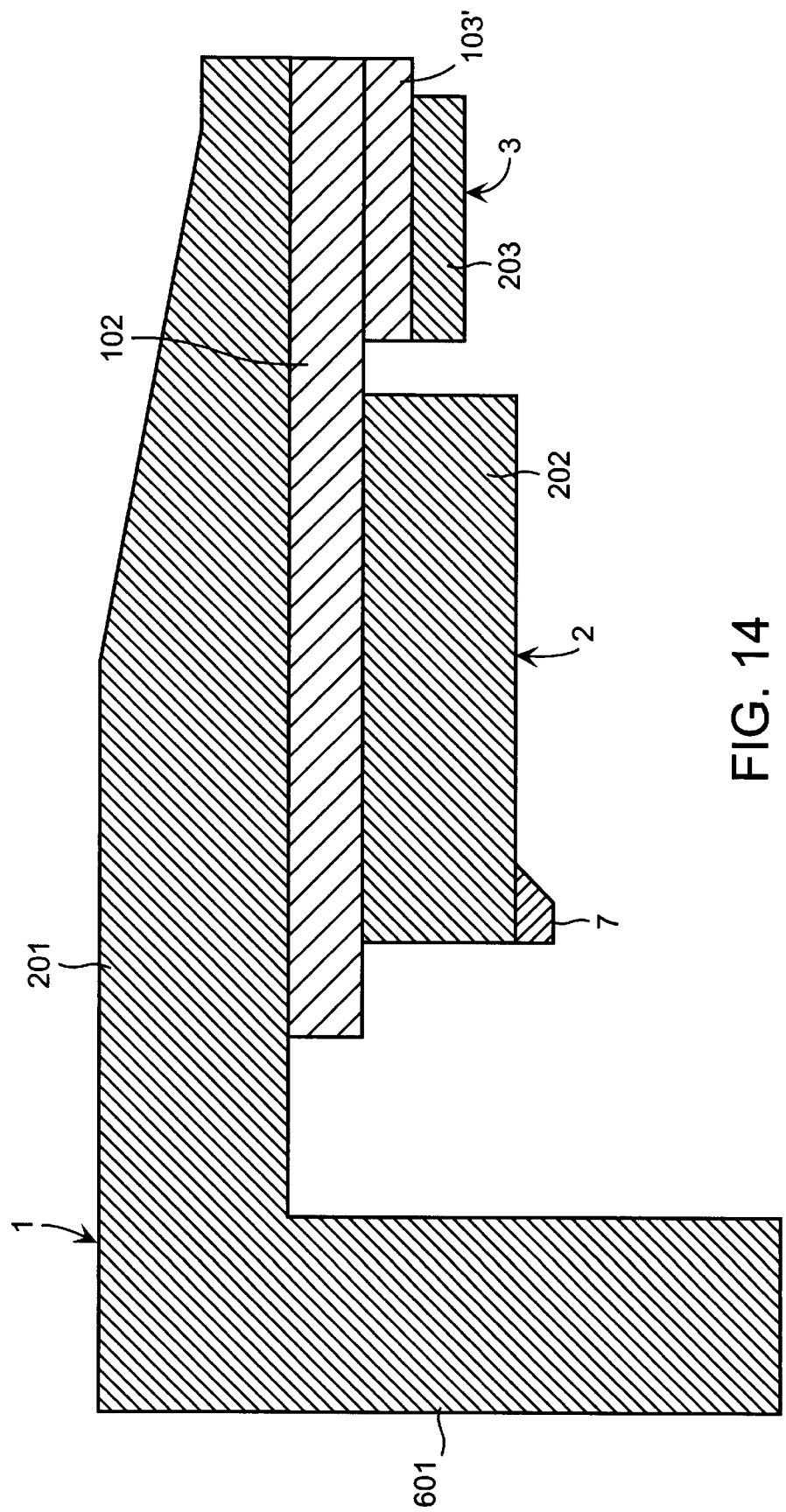

With reference to FIG. 14, a variant is shown in which no member 5 made of magnetized material is provided on the closed transverse side. In this case, a similar effect may be obtained by providing a projection, along the edge of the plate 202 of the main poles, directed towards the opposite main pole. In the example shown herein, the projection comprises a bar 7 having a trapezoidal section, which extends flush with the edge of the plate 202 of the main poles 2, opposite the opening 501. The bar 7 is also made of a high permeability material, preferably, the same material as the plate 202.

Figure 6:
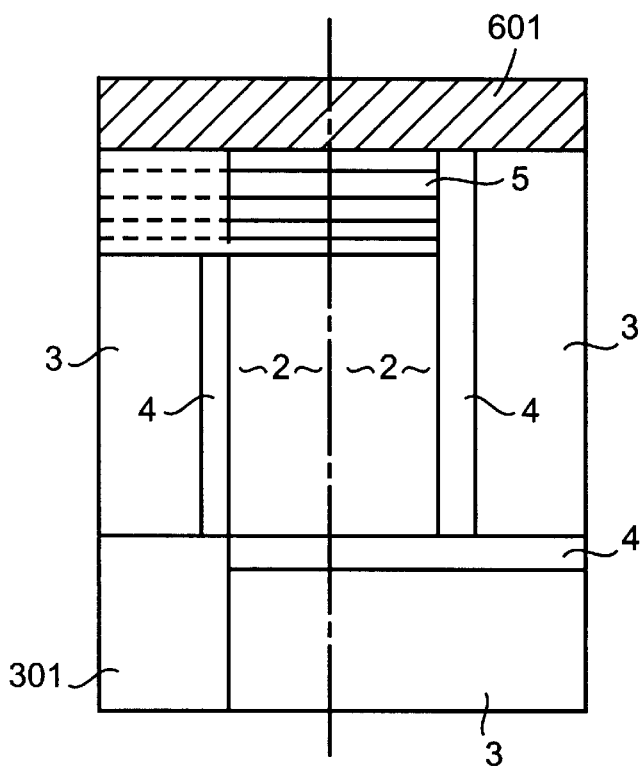
FIG. 6 is a plan view of the inner face of one of the two parallel branches of the magnet according to FIGS. 4 and 5, and showing different variants thereof.

With particular reference to FIGS. 4 and 6, the views shown therein are composite and each half of the figure shows two variants of the U-shaped magnet. A first variant shown in the right half of FIG. 4 provides no field correction along the other open sides perpendicular to the side 501. In this case, the main poles 2, the auxiliary poles 3, the magnetized inserts 4, the members of magnetized material 5 extend over the whole length of the open transverse side 501.

The left half and FIG. 6 show configurations in which the arrangements provided on the open transverse side 501 are also applied to the other opposite open sides perpendicular thereto. The arrangements shown therein are like those described regarding the auxiliary poles along the open transverse side 501. However, along the open sides, there may be also provided arrangements of the same type as described with reference to the previous embodiments.

The plan view of FIG. 6 shows different forms of transition between the auxiliary poles 3 and the magnetized inserts 4 along the individual open sides. This figure only shows some possibilities thereof. In the left half, the two auxiliary poles 3 and the possible magnetized inserts 4 terminate flush with the side of the main pole 2 associated therewith, which is transverse to their longitudinal extension. By this arrangement, there is no contact between the auxiliary poles 3 on the individual open sides and between the corresponding magnetized inserts 4. The end facing the closed transverse side may terminate in the same way as described along the open side 501, and the magnetized members 5 may extend over the whole length of the transverse side opposite to the transverse opening 601 or may terminate flush with the main pole 2. As indicated in the variant shown on the left side of FIG. 6, one of the two auxiliary poles 3 may extend right to the end of the corresponding open side, in this case of the side 501, whereas the auxiliary pole 3 and the magnetized insert 4, if there is any, along the open side perpendicular thereto abut against the first auxiliary pole and/or the first magnetized insert. Alternatively, the auxiliary poles 3 on all open sides and the magnetized inserts 4 which may be provided may extend without interruption coaxially surrounding, like a frame, the corresponding main pole 2.

According to a further variant, as shown in the right half of FIG. 4, the two opposite parallel sides of the yoke 1 may be tapered in the direction of the open side 501. In this case, the two ends are either thinned from the outside or flattened or chamfered 701, at their edges.

This condition is shown with reference to a magnet having four completely open sides, or an open perimeter of a prism having a circular or polygonal base.

FIG. 13 shows a variant embodiment, differing from the others in that the magnetized members 5 and inserts have surfaces for contact with all the elements around them, whereas their free faces are inclined so as to be connected to the associated edges of the inner faces of the poles 2, 3. This embodiment also has the advantages of the invention but has some construction inconveniences, since the fabrication of parts not having rectangular parallelepiped or cubic shapes is more expensive and difficult.

Figure 15:
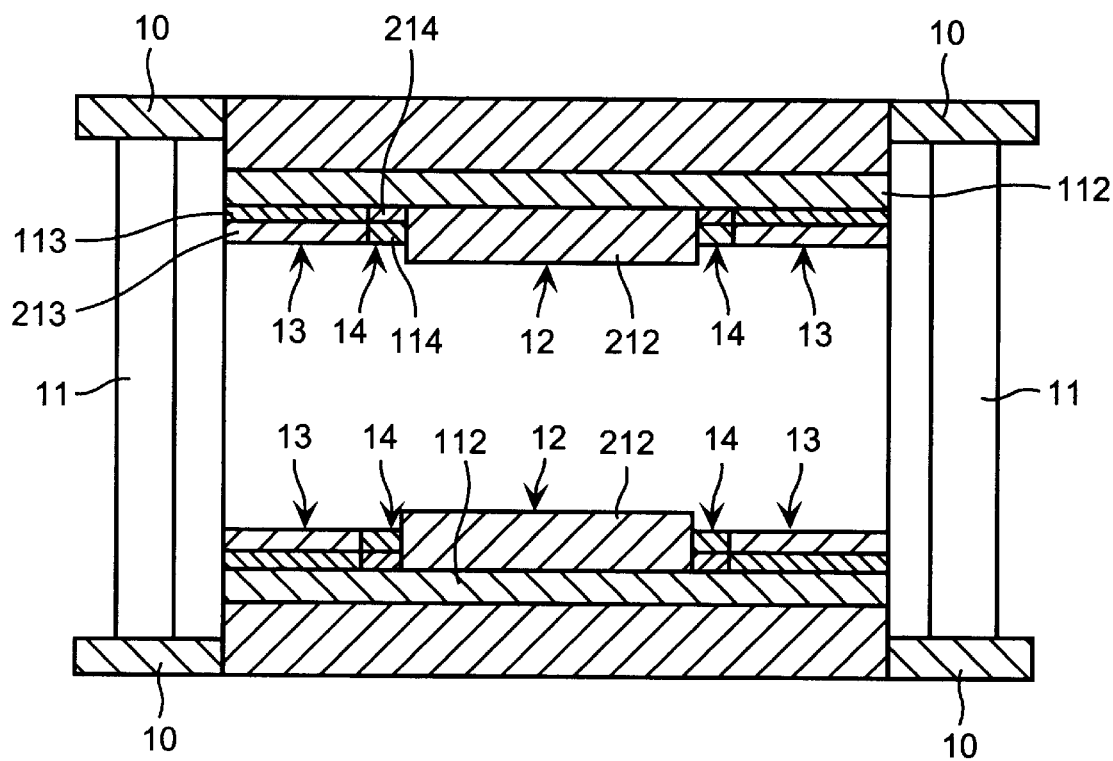
FIG. 15 is a sectional view, with respect to a radial plane, of a magnet having two opposite plates which define a volume completely open at its sides.
Figure 16:
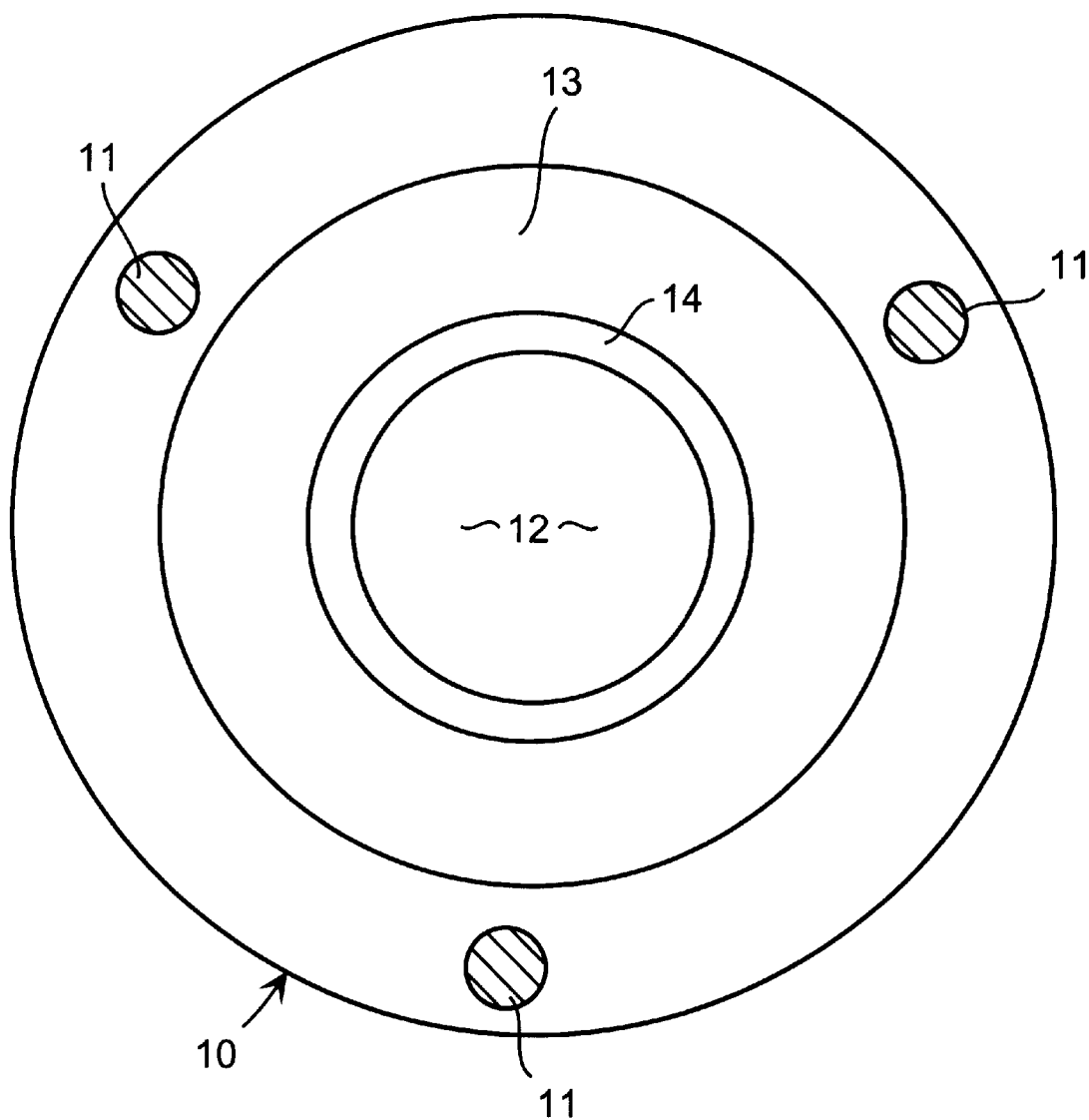
FIG. 16 is a plan view of the inner face of the magnet according to FIG. 14, having circular shape and symmetry.
Figure 17:
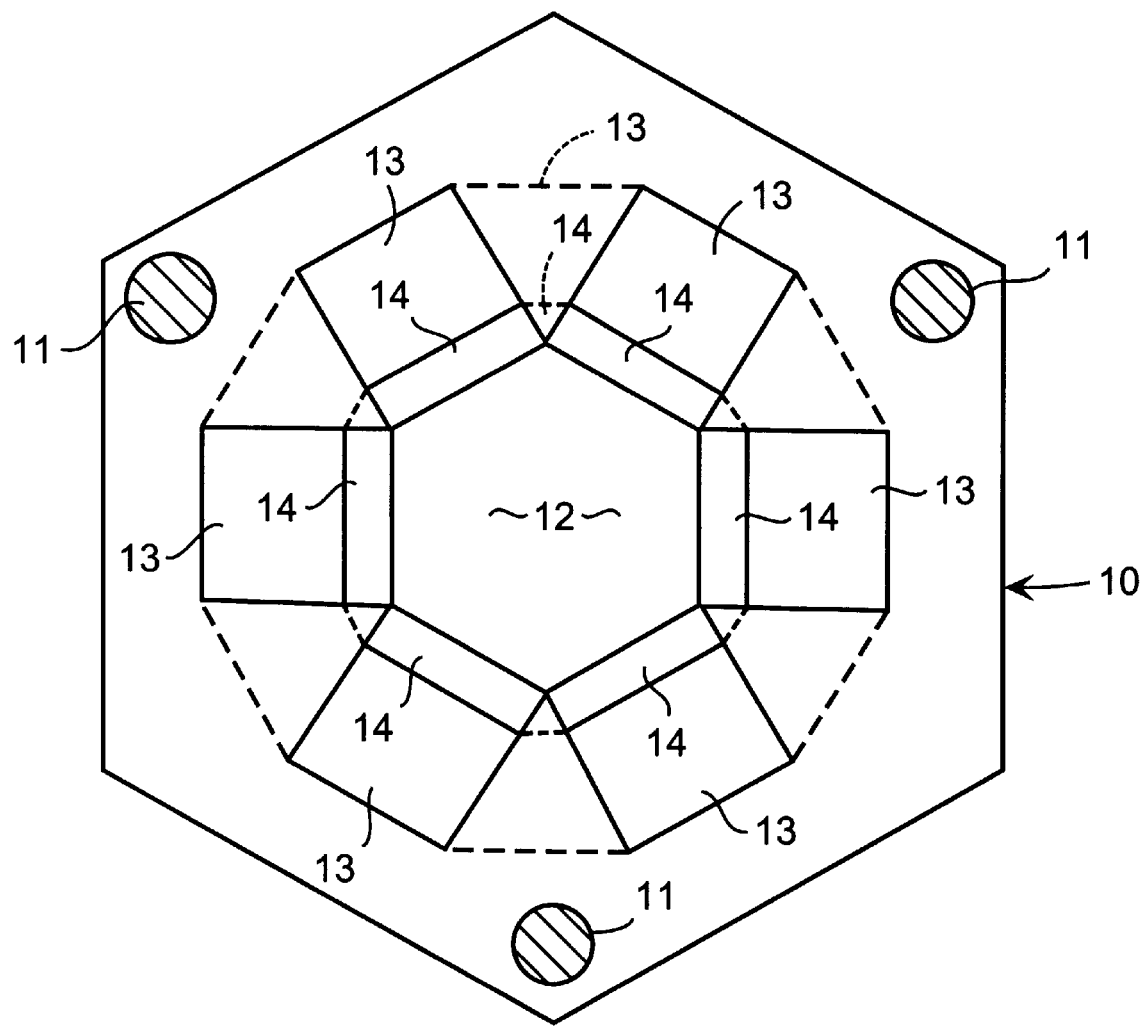
FIG. 17 is a view like that of FIG. 15, the magnet having a hexagonal shape.

FIG. 15 shows a section of such a magnet with respect to a diametrical plane. Two parallel bearing plates 10 are kept at a certain distance from each other by spacers 11 in the form of columns. The two plates 10 coaxially bear each one main pole 12, comprising a layer of magnetized material 112 and a plate of high-permeability material 212. Like in the example of FIG. 4, there are provided auxiliary poles 13 and magnetized inserts 14. As shown in FIGS. 16 and 17, both the auxiliary poles and the magnetized inserts 14 may have perfectly annular shapes or be composed, at least partially, of spaced sectors. The latter configuration is shown in FIG. 17, in which the construction of non parallelepiped members, involving higher costs, due to the minimum tolerances that the parts are required to have with respect to their shape, may be avoided, by limiting the extension of the auxiliary poles 13 and of the magnetized inserts 14 to the length of the individual sides of the main polygonal pole 12.

This criteria may be also taken when choosing among the different configurations illustrated and the different embodiments described herein. In fact, provided that an effective field correction is obtained between the main poles, the best configuration as regards construction, assembly and costs is the one in which the individual members are formed or shaped like rectangular parallelepipeds, or cubes, or similar.

Naturally, the invention is not limited to the embodiments described and illustrated herein, but may be greatly varied, especially as regards construction, without departure from the guiding principle disclosed above and claimed below.

What is claimed is:

1. A permanent magnet for nuclear magnetic resonance image detection, which magnet comprises:

a magnetic structure having a yoke and magnetic poles, so shaped as to delimit or enclose a cavity, at least a part of a volume of the cavity forms a compartment for receiving at least a part of a body under examination, and at least a part of the volume of the cavity is permeated by a static magnetic field having specific intensity and homogeneity characteristics;

the magnetic structure has at least one open side, parallel to the static magnetic field;

the magnetic structure has at least two opposite main poles, lying face to face, transverse to the open side, the static magnetic field being generated therebetween;

in the vicinity of the open side, the magnet has means for correcting the static magnetic field generated between the main poles, the correction means including means for increasing the magnetic potential near the open side, and over a predetermined depth therefrom, transverse to the open side, without reducing the span of the opening;

the correcting means including, at the open side, a pair of opposite auxiliary poles, inwardly penetrating over a predetermined distance towards their respective main poles, which auxiliary poles are provided with magnetized material;

wherein the main poles and the auxiliary poles have parallel magnetization vectors, oriented in the same direction.

2. A magnet as claimed in claim 1, wherein the main poles and the auxiliary poles are composed of a layer of magnetized material, and of a plate made of a high-permeability plate, the two plates being arranged in such a way that the inner free faces of the poles are parallel.

3. A magnet as claimed in claim 2, wherein the plates made of ferromagnetic material of the main poles and of the secondary poles are at a distance from each other.

4. A magnet as claimed in claim 3, wherein the plates made of ferromagnetic or high-permeability material associated with the poles have the same thickness for both poles or different thicknesses.

5. A magnet as claimed in claim 3, wherein the layers of magnetized material, associated with the poles are in contact with each other, whereas in a throat formed between the plates made of ferromagnetic material of adjacent main and auxiliary poles, a magnetized insert is housed, which is in direct contact with one or both layers of magnetized material and with the opposite edges of the plates made of high-permeability material.

6. A magnet as claimed in claim 5, wherein the magnetized inserts are composed of a layer of magnetized material and of a layer of low-permeability material, the layer of low-permeability material being placed in direct contact with the layers of magnetized material of the auxiliary and main poles.

7. A magnet as claimed in claim 6, wherein the layer of low-permeability material of the magnetized inserts includes a compartment for holding the layer of magnetized material, interposed between the latter and the layers of magnetized material and the plates of the main and auxiliary poles.

8. A magnet as claimed in claim 7, wherein the compartment made of low-permeability material of the magnetized inserts is also closed on the side facing the opposite poles.

9. A magnet as claimed in claim 8, wherein the inner faces of the magnetized inserts extend flush with and parallel to the inner face of the auxiliary pole and/or of the main pole, associated thereto.

10. A magnet as claimed in claim 9, wherein the inner faces of the magnetized inserts connect the edges of the opposite sides of the inner faces of the two associated auxiliary and main poles.

11. A magnet as claimed in claim 2, wherein the layers of magnetized material, associated with the poles have equal thicknesses for both poles or different thicknesses, and are made of the same material or of different materials.

12. A magnet as claimed in claim 1, wherein the permanent magnet has a structure having the shape of a rectangular parallelepiped and only one open side, the auxiliary poles are provided along the edges of the open side, parallel to the main pole and having at least a partial extension, corresponding to that of the main pole in the direction parallel to the open side.

13. A magnet as claimed in claim 1, wherein the permanent magnet has a rectangular parallelepiped shape and two opposite open sides, there being provided an auxiliary pole along the edges of each open side, parallel to the corresponding main pole.

14. A magnet as claimed in claim 1, wherein the permanent magnet has a rectangular parallelepiped shape and three adjacent open sides, one open side being parallel to one transverse connecting side between two other parallel sides, which bear the main poles, whereas the auxiliary poles are provided at least along the edges of the open side and have an extension corresponding to the extension of the main pole in the direction parallel to the open side.

15. A magnet as claimed in claim 14, wherein on the side transverse to the main poles, there is provided a member made of magnetized material, whose magnetization vector has at least one component transverse to the magnetization vector of the main poles, which component is oriented in the direction of the transverse side.

16. A magnet as claimed in claim 15, wherein the member made of magnetized material has a face turned towards the main poles, which may be plane and perpendicular to the inner faces thereof, concave or convex, whereas the member made of magnetized material may be divided into two parts, possibly spaced symmetrically to the median plane parallel to the pole faces.

17. A magnet as claimed in claim 16, wherein the member made of magnetized material may terminate with the layer of magnetized material and/or with the plate, or both being at a certain distance from the main poles or in contact therewith.

18. A magnet as claimed in claim 16, wherein the member made of magnetized material extends over the whole length of the side transverse to the poles or only over a part thereof, preferably corresponding to the extension of the poles.

19. A magnet as claimed in claim 14, wherein the main poles and the auxiliary poles, and, if any, the magnetized inserts extend over the whole length of the open side between the two other opposite open sides.

20. A magnet as claimed in claim 19, wherein the auxiliary poles and, if any, the magnetized inserts along the two opposite open sides extend at least over the whole extension of the main pole.

21. A magnet as claimed in claim 20, wherein the auxiliary poles and, if any, the magnetized inserts extend to such an extent that they mutually abut against one another in the corner regions between the open sides, wholly surrounding the sides of the main poles facing towards the openings.

22. A magnet as claimed in claim 21, wherein the auxiliary poles and, if any, the magnetized inserts wholly surround like coaxial frames the sides of the main poles facing towards the openings.

23. A magnet as claimed in claim 14, wherein the auxiliary poles and, if any, the magnetized inserts are also provided along the other two open sides.

24. A magnet as claimed in claim 1, wherein the main poles have at least one rib, projecting in the direction of the opposite main pole, and extending along the edge facing towards the opening which is parallel to the side transverse to the poles.

25. A magnet as claimed in claim 24, wherein the rib is made of a high-permeability material.

26. A magnet as claimed in claim 24, wherein the rib extends over the whole length of the corresponding main pole or over a part of the length.

27. A magnet as claimed in claim 24, wherein the rib has a rectangular trapezoidal section, and extends flush with the edge of the corresponding main pole, opposite to the opening.

28. A magnet as claimed in claim 1, wherein the permanent magnet has a parallelepiped or cylindrical shape, with a wholly open shell, and that the main poles are provided on two opposite plates, whereas the auxiliary poles and, if any, the magnetized inserts are arranged concentrically around the main poles, extending without interruption like a frame.

29. A magnet as claimed in claim 28, wherein the auxiliary poles and, if any, the magnetized inserts, consist of segments having a predetermined length, and being equally spaced around the main poles.

30. A magnet as claimed in claim 29, wherein the main poles have a polygonal plan, whereas the auxiliary poles and, if any, the magnetized inserts, have rectangular or square shapes, and only extend over the length of the associated side of the main pole.

31. A magnet as claimed in claim 30, wherein the magnetization layer associated with the auxiliary poles is thicker, as a whole, than that associated with the main poles, whereas the thickness of the plates made of high-permeability material is such that the free faces of the plates extend at least coplanar, or the free faces of the opposite auxiliary poles are at a greater distance with respect to the main poles.

32. A magnet as claimed in claim 1, wherein the permanent magnet is U-shaped, whereas the ends of the two opposite parallel sides are tapered towards the open side, opposite to the closed transverse side, the edges perpendicular to the poles being provided with chamfers, which may extend over the depth of the auxiliary pole.

33. A permanent magnet as claimed in claim 1, wherein
the magnetized material associated with the auxiliary poles is in a larger quantity and of a different quality with respect to the magnetized material associated with the main poles, in such a way as to obtain an increase of the magnetic potential in the area between the auxiliary poles with respect to that between the main poles; and
a distance between the pairs of opposite auxiliary poles is at least equal to, or greater than a distance between the main poles.

34. A permanent magnet for nuclear magnetic resonance image detection, which magnet comprises:
a magnetic structure having a yoke and magnetic poles, so shaped as to delimit or enclose a cavity, at least a part of a volume of the cavity forms a compartment for receiving at least a part of a body under examination, and at least a part of the volume of the cavity is permeated by a static magnetic field having specific intensity and homogeneity characteristics;
the magnetic structure has at least one open side, parallel to the static magnetic field;
the magnetic structure has at least two opposite main poles, lying face to face, transverse to the open side, the static magnetic field being generated therebetween;
in the vicinity of the open side, the magnet has means for correcting the static magnetic field generated between the main poles, the correction means including means for increasing the magnetic potential near the open side, and over a predetermined depth therefrom, transverse to the open side, without reducing the span of the opening;
wherein the correcting means includes, at the open side, a pair of opposite auxiliary poles, inwardly penetrating over a predetermined distance towards their respective main poles, which auxiliary poles are provided with magnetized material, and
the magnetized material associated with the auxiliary poles is equal as regards quantity and type to the magnetized material associated with the main poles, and between the main pole and the adjacent auxiliary pole, a magnetized insert is interposed, so as to generate a magnetic potential difference between the main poles and the adjacent auxiliary poles, whereby the magnetic potential of the auxiliary poles is increased with respect to the potential of the main pole.

35. A magnet as claimed in claim 34, wherein the magnetized insert has a magnetization vector with at least one component transverse to the magnetization vectors of the main and auxiliary poles or parallel to the faces of the poles, which component is oriented in the direction of the main pole.

36. A permanent magnet for nuclear magnetic resonance image detection, which magnet comprises:
a magnetic structure having a yoke and magnetic poles, so shaped as to delimit or enclose a cavity, at least a part of a volume of the cavity forms a compartment for receiving at least a part of a body under examination, and at least a part of the volume of the cavity is permeated by a static magnetic field having specific intensity and homogeneity characteristics;
the magnetic structure has at least one open side, parallel to the static magnetic field;
the magnetic structure has at least two opposite main poles, lying face to face, transverse to the open side, the static magnetic field being generated therebetween;
in the vicinity of the open side, the magnet has at the open side, a pair of opposite auxiliary poles, inwardly penetrating over a predetermined distance towards their respective main poles, which auxiliary poles are provided with magnetized material for increasing the magnetic potential near the open side, and over a predetermined depth therefrom, transverse to the open side, without reducing the span of the opening;
wherein the main poles and the auxiliary poles have parallel magnetization vectors, oriented in the same direction.

37. A permanent magnet for nuclear magnetic resonance image detection, which magnet comprises:
a magnetic structure having a yoke and magnetic poles, so shaped as to delimit or enclose a cavity, at least a part of a volume of the cavity forms a compartment for receiving at least a part of a body under examination, and at least a part of the volume of the cavity is permeated by a static magnetic field having specific intensity and homogeneity characteristics;

the magnetic structure has at least one open side, parallel to the static magnetic field;

the magnetic structure has at least two opposite main poles, lying face to face, transverse to the open side, the static magnetic field being generated therebetween;

in the vicinity of the open side, the magnet has at the open side, a pair of opposite auxiliary poles, inwardly penetrating over a predetermined distance towards their respective main poles, which auxiliary poles are provided with magnetized material for increasing the magnetic potential near the open side, and over a predetermined depth therefrom, transverse to the open side; and a distance between the pair of auxiliary poles being greater than a distance between the two opposite main poles so as to enable easy access to the compartment.

38. A permanent magnet for nuclear magnetic resonance image detection, which magnet comprises:

a magnetic structure having a yoke and magnetic poles, so shaped as to delimit or enclose a cavity, at least a part of a volume of the cavity forms a compartment for receiving at least a part of a body under examination, and at least a part of the volume of the cavity is permeated by a static magnetic field having specific intensity and homogeneity characteristics;

the magnetic structure has at least one open side, parallel to the static magnetic field;

the magnetic structure has at least two opposite main poles, lying face to face, transverse to the open side, the static magnetic field being generated therebetween;

in the vicinity of the open side, the magnet has means for correcting the static magnetic field generated between the main poles, the correction means including means for increasing the magnetic potential near the open side, and over a predetermined depth therefrom, transverse to the open side, without reducing the span of the opening;

wherein the correcting means includes, at the open side, a pair of opposite auxiliary poles, inwardly penetrating over a predetermined distance towards their respective main poles, which auxiliary poles are provided with magnetized material, and the magnetized material associated with the auxiliary poles is in a larger quantity and of a different quality with respect to the magnetized material associated with the main poles, in such a way as to obtain an increase of the magnetic potential in the area between the auxiliary poles with respect to that between the main poles.

* * * * *